(12) United States Patent
Truong et al.

(10) Patent No.: US 8,459,776 B2
(45) Date of Patent: Jun. 11, 2013

(54) MULTICOLOR ELECTRONIC DEVICES AND PROCESSES OF FORMING THE SAME BY PRINTING

(75) Inventors: Nugent Truong, Ventura, CA (US); Matthew Stainer, Goleta, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/202,235

(22) PCT Filed: Mar. 8, 2010

(86) PCT No.: PCT/US2010/026469
§ 371 (c)(1),
(2), (4) Date: Aug. 18, 2011

(87) PCT Pub. No.: WO2010/102274
PCT Pub. Date: Sep. 10, 2010

(65) Prior Publication Data
US 2011/0298863 A1    Dec. 8, 2011

Related U.S. Application Data

(60) Provisional application No. 61/158,017, filed on Mar. 6, 2009.

(51) Int. Cl.
*B41J 2/15*    (2006.01)
*B41J 2/145*    (2006.01)

(52) U.S. Cl.
USPC .................................. 347/40; 347/41; 347/43

(58) Field of Classification Search
USPC ............... 347/5, 9–12, 14–15, 20, 40–43, 54, 347/56–57
See application file for complete search history.

(56) References Cited

U.S. PATENT DOCUMENTS

| 5,592,202 | A |  | 1/1997 | Erickson |  |
| 6,655,783 | B2 | * | 12/2003 | Otsuki | ............................ 347/43 |

(Continued)

FOREIGN PATENT DOCUMENTS

| CN | 1605465 A | 4/2005 |
| CN | 1994739 A | 7/2007 |

(Continued)

OTHER PUBLICATIONS

ISR 20101213; PCT International Search Report for Application No. PCT/US2010/037231; Kim, Chang Gyun, Authorized Officer; Dec. 13, 2010.

(Continued)

*Primary Examiner* — Thinh Nguyen (57) ABSTRACT

There is provided a method of printing a regular array of rows of subpixels on a workpiece. The subpixels have c different colors and have a subpixel pitch s. A printing head has z nozzles arranged in a row with a spacing p, where $z=n_1(c)$ and $p=(c-1)(s)$, the printhead being at a first position relative to the workpiece. There are c different printing inks, one for each of the c colors, and each of the printing inks is supplied to the nozzles in a regular alternating pattern. The method includes steps of printing a first set of z rows of subpixels with the printing head; moving the workpiece laterally relative to the printing head by a distance $d_1$, where $d_1=z(s)$; printing a second set of z rows of subpixels with the printing head; repeating the printing steps $n_2$ times for a total of $n_2+2$ sets of z rows of subpixels. Variables include:

c, an integer greater than 1;
$n_1$, an integer greater than 0, with the proviso that when c is an odd number, then $n_1$ is an odd number; and
$n_2$, an integer greater than 0.

7 Claims, 7 Drawing Sheets

U.S. PATENT DOCUMENTS

| | | |
|---|---|---|
| 6,670,645 B2 | 12/2003 | Grushin et al. |
| 7,296,868 B2 | 11/2007 | Shibata et al. |
| 2006/0290732 A1 | 12/2006 | Park et al. |
| 2007/0190233 A1 | 8/2007 | Chung |
| 2008/0067924 A1 | 3/2008 | Prakash et al. |
| 2008/0157659 A1 | 7/2008 | Prakash |
| 2011/0181899 A1 | 7/2011 | Stainer et al. |
| 2011/0298863 A1 | 12/2011 | Truong et al. |
| 2012/0044512 A1 | 2/2012 | Truong et al. |
| 2012/0045568 A1 | 2/2012 | Truong et al. |

FOREIGN PATENT DOCUMENTS

| | | | |
|---|---|---|---|
| JP | 08300694 | A | 11/1996 |
| JP | 09138306 | A | 5/1997 |
| JP | 11048503 | A | 2/1999 |
| JP | 2001185355 | A | 7/2001 |
| JP | 2003117460 | A | 4/2003 |
| JP | 2004358314 | A | 12/2004 |
| JP | 2005087801 | A | 4/2005 |
| JP | 2007256312 | A | 10/2007 |
| JP | 2008197149 | A | 8/2008 |
| KR | 1020060064784 | A | 6/2006 |
| KR | 100759838 | B1 | 9/2007 |
| WO | 03008424 | A1 | 1/2003 |
| WO | 03040257 | A1 | 5/2003 |
| WO | 03063555 | A1 | 7/2003 |
| WO | 03091688 | A2 | 11/2003 |
| WO | 2004016710 | A1 | 2/2004 |
| WO | 2007145979 | A2 | 12/2007 |

OTHER PUBLICATIONS

ISR 20090206; PCT International Search Report for Application No. PCT/US2008/086150; Young, Lee W., Authorized Officer; Feb. 6, 2009.

ISR 20100525; PCT International Search Report for Application No. PCT/US2009/06140; Kim, Ju Seung, Authorized Officer; May 25, 2010.

ISR 20101015; PCT International Search Report for Application No. PCT/US2010/026469; Han, Man Yeol, Authorized Officer; Oct. 15, 2010.

ISR 20101213; PCT International Search Report for Application No. PCT/US2010/037231; Kim, Chang Gyun, Authorized Officer; Dec. 13, 2010 .

ISR 20101213; PCT International Search Report for Application No. PCT/US2010/037247; Kim, Chang Gyun, Authorized Officer; Dec. 13, 2010.

* cited by examiner

| Printer |
|---|
| Color M1 |
| Color M2 |
| Color M1 |
| Color M2 |
| Color M1 |
| Color M2 |

| | Print # | 1 | 2 | 3 | 4 |
|---|---|---|---|---|---|
| A1 | | M1 | | | |
| | | M2 | | | |
| | | M1 | | | |
| | | M2 | | | |
| | | M1 | | | |
| | | M2 | | | |
| A2 | | | M1 | | |
| | | | M2 | | |
| | | | M1 | | |
| | | | M2 | | |
| | | | M1 | | |
| | | | M2 | | |
| A3 | | | | M1 | |
| | | | | M2 | |
| | | | | M1 | |
| | | | | M2 | |
| | | | | M1 | |
| | | | | M2 | |
| A4 | | | | | M1 |
| | | | | | M2 |
| | | | | | M1 |
| | | | | | M2 |
| | | | | | M1 |
| | | | | | M2 |

| Pattern | Subpixel Row |
|---|---|
| Color M1 row | 1 |
| Color M2 row | 2 |
| Color M1 row | 3 |
| Color M2 row | 4 |
| Color M1 row | 5 |
| Color M2 row | 6 |
| Color M1 row | 7 |
| Color M2 row | 8 |
| Color M1 row | 9 |
| Color M2 row | 10 |
| Color M1 row | 11 |
| Color M2 row | 12 |
| Color M1 row | 13 |
| Color M2 row | 14 |
| Color M1 row | 15 |
| Color M2 row | 16 |
| Color M1 row | 17 |
| Color M2 row | 18 |
| Color M1 row | 19 |
| Color M2 row | 20 |
| Color M1 row | 21 |
| Color M2 row | 22 |
| Color M1 row | 23 |
| Color M2 row | 24 |

FIG. 5

| Printer |
|---|
| Red |
| Green |
| Blue |
| Red |
| Green |
| Blue |
| Red |
| Green |
| Blue |

| Print # | 1 | 2 | 3 | 4 | 5 |
|---|---|---|---|---|---|
| A1 | R |   |   |   |   |
|    |   |   |   |   |   |
|    | G |   |   |   |   |
|    |   |   |   |   |   |
|    | B |   |   |   |   |
|    |   |   |   |   |   |
|    | R |   |   |   |   |
|    |   |   |   |   |   |
|    | G |   |   |   |   |
| A2 |   | R |   |   |   |
|    | B |   |   |   |   |
|    |   |   G |   |   |   |
|    | R |   |   |   |   |
|    |   | B |   |   |   |
|    | G |   |   |   |   |
|    |   | R |   |   |   |
|    | B |   |   |   |   |
|    |   | G |   |   |   |
| A3 |   |   | R |   |   |
|    |   | B |   |   |   |
|    |   |   | G |   |   |
|    |   | R |   |   |   |
|    |   |   | B |   |   |
|    |   | G |   |   |   |
|    |   |   | R |   |   |
|    |   | B |   |   |   |
|    |   |   | G |   |   |
| A4 |   |   |   | R |   |
|    |   |   | B |   |   |
|    |   |   |   | G |   |
|    |   |   | R |   |   |
|    |   |   |   | B |   |
|    |   |   | G |   |   |
|    |   |   |   | R |   |
|    |   |   | B |   |   |
|    |   |   |   | G |   |
| A5 |   |   |   |   | R |
|    |   |   |   | B |   |
|    |   |   |   |   | G |
|    |   |   |   | R |   |
|    |   |   |   |   | B |
|    |   |   |   | G |   |
|    |   |   |   |   | R |
|    |   |   |   | B |   |
|    |   |   |   |   | G |
|    |   |   |   |   |   |
|    |   |   |   |   | B |
|    |   |   |   |   |   |
|    |   |   |   |   | R |
|    |   |   |   |   |   |
|    |   |   |   |   | G |
|    |   |   |   |   |   |
|    |   |   |   |   | B |

| Pattern | Subpixel Row |
|---|---|
| Red row | 1 |
|  | 2 |
| Green row | 3 |
|  | 4 |
| Blue row | 5 |
|  | 6 |
| Red row | 7 |
|  | 8 |
| Green row | 9 |
| Red row | 10 |
| Blue row | 11 |
| Green row | 12 |
| Red row | 13 |
| Blue row | 14 |
| Green row | 15 |
| Red row | 16 |
| Blue row | 17 |
| Green row | 18 |
| Red row | 19 |
| Blue row | 20 |
| Green row | 21 |
| Red row | 22 |
| Blue row | 23 |
| Green row | 24 |
| Red row | 25 |
| Blue row | 26 |
| Green row | 27 |
| Red row | 28 |
| Blue row | 29 |
| Green row | 30 |
| Red row | 31 |
| Blue row | 32 |
| Green row | 33 |
| Red row | 34 |
| Blue row | 35 |
| Green row | 36 |
| Red row | 37 |
| Blue row | 38 |
| Green row | 39 |
| Red row | 40 |
| Blue row | 41 |
| Green row | 42 |
| Red row | 43 |
| Blue row | 44 |
| Green row | 45 |
|  | 46 |
| Blue row | 47 |
|  | 48 |
| Red row | 49 |
|  | 50 |
| Green row | 51 |
|  | 52 |
| Blue row | 53 |

FIG. 6

| Printer |
|---------|
| M1 |
| M2 |
| M3 |
| M4 |
| M1 |
| M2 |
| M3 |
| M4 |

| | Print # | 1 | 2 | 3 | 4 | 5 |
|---|---|---|---|---|---|---|
| A1 | | M1 | | | | |
| | | | | | | |
| | | | | | | |
| | | M2 | | | | |
| | | | | | | |
| | | | | | | |
| | | M3 | | | | |
| A2 | | | M1 | | | |
| | | M4 | | | | |
| | | | | | | |
| | | | M2 | | | |
| | | M1 | | | | |
| | | | | | | |
| | | | M3 | | | |
| A3 | | M2 | | | | |
| | | | | M1 | | |
| | | | M4 | | | |
| | | M3 | | | | |
| | | | | M2 | | |
| | | | M1 | | | |
| | | M4 | | | | |
| A4 | | | | M3 | | |
| | | | M2 | | | |
| | | | | | M1 | |
| | | | | M4 | | |
| | | | M3 | | | |
| | | | | | M2 | |
| | | | | M1 | | |
| | | | M4 | | | |
| | | | | M3 | | |
| A5 | | | | M2 | | |
| | | | | | | M1 |
| | | | | | M4 | |
| | | | | M3 | | |
| | | | | | | M2 |
| | | | | | M1 | |
| | | | | M4 | | |
| | | | | | M3 | |
| | | | | | M2 | |
| | | | | | | |
| | | | | | | M4 |
| | | | | | M3 | |
| | | | | | | |
| | | | | | M1 | |
| | | | | M4 | | |
| | | | | | | |
| | | | | | | M2 |
| | | | | | | |
| | | | | | | |
| | | | | | | M3 |
| | | | | | | |
| | | | | | | |
| | | | | | | M4 |

| Pattern | Subpixel Row |
|---------|--------------|
| M1 row | 1 |
| | 2 |
| | 3 |
| M2 row | 4 |
| | 5 |
| | 6 |
| M3 row | 7 |
| | 8 |
| M1 row | 9 |
| M4 row | 10 |
| | 11 |
| M2 row | 12 |
| M1 row | 13 |
| | 14 |
| M3 row | 15 |
| M2 row | 16 |
| M1 row | 17 |
| M4 row | 18 |
| M3 row | 19 |
| M2 row | 20 |
| M1 row | 21 |
| M4 row | 22 |
| M3 row | 23 |
| M2 row | 24 |
| M1 row | 25 |
| M4 row | 26 |
| M3 row | 27 |
| M2 row | 28 |
| M1 row | 29 |
| M4 row | 30 |
| M3 row | 31 |
| M2 row | 32 |
| M1 row | 33 |
| M4 row | 34 |
| M3 row | 35 |
| M2 row | 36 |
| M1 row | 37 |
| M4 row | 38 |
| M3 row | 39 |
| M2 row | 40 |
| | 41 |
| M4 row | 42 |
| M3 row | 43 |
| | 44 |
| M1 row | 45 |
| M4 row | 46 |
| | 47 |
| M2 row | 48 |
| | 49 |
| | 50 |
| M3 row | 51 |
| | 52 |
| | 53 |
| M4 row | 54 |

FIG. 7

| Printer |
|---|
| M1 |
| M2 |
| Blank |
| M1 |
| M2 |
| Blank |
| M1 |
| M2 |
| Blank |

| Print # | 1 | 2 | 3 | 4 | 5 |
|---|---|---|---|---|---|
| A1 | M1 | | | | |
|  | | | | | |
|  | M2 | | | | |
|  | | | | | |
|  | | | | | |
|  | | | | | |
|  | M1 | | | | |
|  | | | | | |
|  | M2 | | | | |
| A2 | | M1 | | | |
|  | | | | | |
|  | | M2 | | | |
|  | M1 | | | | |
|  | | | | | |
|  | M2 | | | | |
|  | | M1 | | | |
|  | | | | | |
|  | | M2 | | | |
| A3 | | | M1 | | |
|  | | | | | |
|  | | | M2 | | |
|  | | M1 | | | |
|  | | | | | |
|  | | M2 | | | |
|  | | | M1 | | |
|  | | | | | |
|  | | | M2 | | |
| A4 | | | | M1 | |
|  | | | | | |
|  | | | | M2 | |
|  | | | M1 | | |
|  | | | | | |
|  | | | M2 | | |
|  | | | | M1 | |
|  | | | | | |
|  | | | | M2 | |
| A5 | | | | | M1 |
|  | | | | | |
|  | | | | | M2 |
|  | | | | M1 | |
|  | | | | | |
|  | | | | M2 | |
|  | | | | | M1 |
|  | | | | | |
|  | | | | | M2 |
|  | | | | | |
|  | | | | | |
|  | | | | | |
|  | | | | | M1 |
|  | | | | | |
|  | | | | | M2 |

| Pattern | Subpixel Row |
|---|---|
| M1 row | 1 |
|  | 2 |
| M2 row | 3 |
|  | 4 |
|  | 5 |
|  | 6 |
| M1 row | 7 |
|  | 8 |
| M2 row | 9 |
| M1 row | 10 |
|  | 11 |
| M2 row | 12 |
| M1 row | 13 |
|  | 14 |
| M2 row | 15 |
| M1 row | 16 |
|  | 17 |
| M2 row | 18 |
| M1 row | 19 |
|  | 20 |
| M2 row | 21 |
| M1 row | 22 |
|  | 23 |
| M2 row | 24 |
| M1 row | 25 |
|  | 26 |
| M2 row | 27 |
| M1 row | 28 |
|  | 29 |
| M2 row | 30 |
| M1 row | 31 |
|  | 32 |
| M2 row | 33 |
| M1 row | 34 |
|  | 35 |
| M2 row | 36 |
| M1 row | 37 |
|  | 38 |
| M2 row | 39 |
| M1 row | 40 |
|  | 41 |
| M2 row | 42 |
| M1 row | 43 |
|  | 44 |
| M2 row | 45 |
|  | 46 |
|  | 47 |
|  | 48 |
| M1 row | 49 |
|  | 50 |
| M2 row | 51 |

MULTICOLOR ELECTRONIC DEVICES AND PROCESSES OF FORMING THE SAME BY PRINTING

RELATED APPLICATION

This application claims priority under 35 U.S.C. §119(e) from Provisional Application No. 61/158,017 filed Mar. 6, 2009, which is incorporated by reference in its entirety.

FIELD OF THE DISCLOSURE

This disclosure relates in general to electronic devices and processes, and more particularly, to electronic devices having electrodes and organic active regions of different colors, and processes of forming the same.

DESCRIPTION OF THE RELATED ART

An electronic device can include a liquid crystal display ("LCD"), an organic light-emitting diode (OLED) display, or the like. The manufacture of electronic devices may be performed using solution deposition techniques. One process of making electronic devices is to deposit organic layers over a substrate by printing (e.g., ink-jet printing, continuous printing, etc.). In a printing process, the liquid composition being printed includes an organic material in a solution, dispersion, emulsion, or suspension with an organic solvent, with an aqueous solvent, or with a combination of solvents. After printing, the solvent(s) is(are) evaporated and the organic material remains to form an organic layer for the electronic device.

Typically, a first color is printed and then the printing device is recalibrated and a second color is printed. In some cases, the substrate with the first printed color is moved to a second printer for printing the second color. This also requires time for setting up the printer and alignment. In many cases, three colors are printed: red, green, and blue. In this case, time must be taken to recalibrate and/or realign with each color. There is a need for improved printing processes.

SUMMARY

There is provided a method of printing a regular array of rows of subpixels on a workpiece, the subpixels having c different colors, and having a subpixel pitch s, said method comprising:
(a) providing a printing head having z nozzles arranged in a row with a spacing between the nozzles of p, where $z=n_1(c)$ and $p=(c-1)(s)$, the printhead being at a first position relative to the workpiece;
(b) providing c different printing inks, one for each of the c colors;
(c) supplying each of the printing inks to the nozzles in a regular alternating pattern;
(d) printing a first set of z rows of subpixels with the printing head;
(e) moving the workpiece laterally relative to the printing head by a distance $d_1$, where $d_1=z(s)$;
(f) printing a second set of z rows of subpixels with the printing head;
(g) repeating steps (e) and (f) $n_2$ times for a total of $(n_2+2)$ sets of z rows of subpixels;
where:
c is an integer greater than 1;
$n_1$ is an integer greater than 0, with the proviso that when c is an odd number, then $n_1$ is an odd number;
$n_2$, is an integer greater than 0.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Printer, the Method of Printing, and the Electronic Device.

1. Definitions and Clarification of Terms

Before addressing details of embodiments described below, some terms are defined or clarified.

The term "array" is intended to mean an ordered arrangement of elements. An array may include pixels, subpixels, cells, or other structures within an ordered arrangement, usually designated by columns and rows. The array can be described in terms of an x-direction and a y-direction.

The term "blue light-emitting component" is intended to mean an electronic component capable of emitting radiation having an emission maximum at a wavelength in a range of approximately 400 to 500 nm.

The term "continuous" and its variants are intended to mean substantially unbroken. In one embodiment, continuously printing is printing using a substantially unbroken stream of a liquid or a liquid composition, as opposed to a depositing technique using drops. In another embodiment, extending continuously refers to a length of a layer, member, or structure in which no significant breaks in the layer, member, or structure lie along its length.

The term "electronic device" is intended to mean a collection of circuits, electronic components, or any combination thereof that collectively, when properly electrically connected and supplied with the appropriate potential(s), performs a function. An electronic device may be included or be part of a system. An example of an electronic device includes a display, a sensor array, a computer system, an avionics system, an automobile, a cellular phone, other consumer or industrial electronic product, or any combination thereof.

The term "green light-emitting component" is intended to mean an electronic component capable of emitting radiation having an emission maximum at a wavelength in a range of approximately 500 to 600 nm.

The term "guest material" is intended to mean a material, within a layer including a host material, that changes the electronic characteristic(s) or the targeted wavelength of radiation emission, reception, or filtering of the layer compared to the electronic characteristic(s) or the wavelength of radiation emission, reception, or filtering of the layer in the absence of such material.

The term "host material" is intended to mean a material, usually in the form of a layer, to which a guest material may or may not be added. The host material may or may not have electronic characteristic(s) or the ability to emit, receive, or filter radiation.

The term "liquid composition" is intended to mean a material that is dissolved in a liquid medium to form a solution, dispersed in a liquid medium to form a dispersion, or suspended in a liquid medium to form a suspension or an emulsion.

The term "liquid medium" is intended to mean a liquid within a solution, dispersion, suspension, or emulsion. The term "liquid medium" is used regardless whether one or more solvents are present, and therefore, liquid medium is used as the singular or plural form (i.e., liquid media) of the term.

The term "nozzle" is intended to mean a portion of an apparatus through which a liquid composition or liquid medium can be dispensed.

The term "oriented" is intended to mean a principal direction in which a feature extends. As between different features at the same elevation or at different elevations, the features may be oriented substantially parallel, substantially perpendicular, or in another angular relationship with respect to each other.

The term "organic active layer" is intended to mean one or more organic layers, wherein at least one of the organic layers, by itself, or when in contact with a dissimilar material is capable of forming a rectifying junction. The term "organic active region" is intended to mean one or more organic region, wherein at least one of the organic regions, by itself, or when in contact with a dissimilar material is capable of forming a rectifying junction.

The term "organic layer" is intended to mean one or more layers, wherein at least one of the layers comprises a material including carbon and at least one other element, such as hydrogen, oxygen, nitrogen, fluorine, etc.

The term "pitch" is intended to mean a sum of a feature dimension and a space dimension between immediately adjacent features.

The term "pixel" is intended to mean the smallest complete, repeating unit of an array. The term "subpixel" is intended to mean a portion of a pixel that makes up only a part, but not all, of a pixel. In a full-color display, a full-color pixel can comprise three sub-pixels with primary colors in red, green and blue spectral regions. A sensor array can include pixels that may or may not include subpixels.

The term "printing" is intended to mean an act of selectively depositing a layer by using a printing head or other similar structure to dispense a liquid or liquid composition onto a workpiece.

The term "printing apparatus" is intended to mean a combination of one or more materials, equipment, assembly or subassembly designed for printing a layer onto a workpiece.

The term "radiation-emitting component" is intended to mean an electronic component, which when properly biased, emits radiation at a targeted wavelength or spectrum of wavelengths. The radiation may be within the visible-light spectrum or outside the visible-light spectrum (UV or IR). A light-emitting component, such as a light-emitting diode, is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "rectifying junction" is intended to mean a junction within a semiconductor layer or within a semiconductor region or a junction formed by an interface between a semiconductor layer or a semiconductor region and a dissimilar material, in which charge carriers of one type flow more easily in one direction through the junction compared to the opposite direction. A pn junction is an example of a rectifying junction that can be used as a diode.

The term "red light-emitting component" is intended to mean an electronic component capable of emitting radiation having an emission maximum at a wavelength in a range of approximately 600 to 700 nm.

The term "resolution limit" is intended to mean the smallest feature size that can be reproducibly formed when using a particular apparatus or other equipment.

The term "visible light spectrum" is intended to mean a radiation spectrum having wavelengths corresponding to approximately 400 to 700 nm.

The term "width" is intended to mean a dimension, as seen from a top view and regardless of layer, which is measured in a direction that corresponds to a narrower dimension of a particular feature. The term "length" is intended to mean a dimension, as seen from a top view and regardless of layer, which is measured in a direction substantially perpendicular to the width.

The term "workpiece" is intended to mean a substrate with one or more device layers thereon. A device layer can be inorganic or organic.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to, give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Printer

Before addressing particular embodiments, the printer is addressed to aid in understanding the concepts as described herein.

Figure 1:
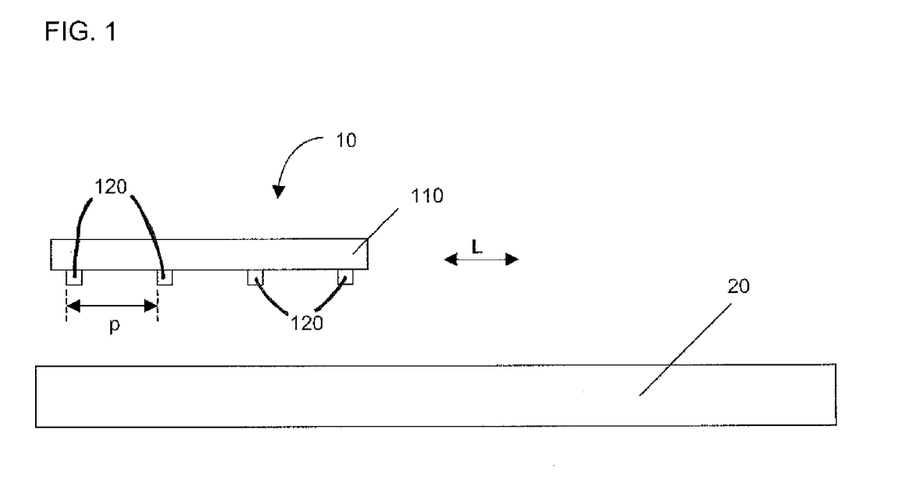
FIG. 1 includes a plan view of a workpiece for making an electronic device including a display.

As shown in FIG. 1, printer 10 has a printing head 110 with nozzles 120 attached. The spacing between the nozzles is shown as p. The printer is attached to lines (not shown) to supply the appropriate liquid composition to each nozzle. The different liquid compositions, one for each color, are supplied in a regular alternating pattern. By this is meant that one of each color is supplied before any are duplicated, and that additional colors are supplied in the same order. In this figure, the first nozzle can have color 1, the second nozzle color 2, the third nozzle color 1, and the fourth nozzle color 2. Thus, in this system:

$c=2$ $z=n_1(c)=n_1(2)=4$, where $n_1=2$ $p=(c-1)s=s$

Because the spacing between nozzles is equal to the subpixel pitch, adjacent nozzles will print into adjacent pixels.

The printing head is shown over workpiece 20. The printing head and workpiece can be moved with respect to each other. When printing, the printing head will move in the direction in and out of the plane of the paper with respect to the workpiece. The printing head will also move laterally with respect to the workpiece as shown by L. This movement is relative. In some cases, the workpiece is moved. In some cases, the printing head is moved. In some cases, both the printing head and the workpiece are moved. For simplicity, the movement will be addressed as if only the printing head moved, and as if the workpiece were stationery. It will be understood that either or both of the printing head and workpiece can be moved and it is only their movement relative to each other that is at issue.

Figure 2:
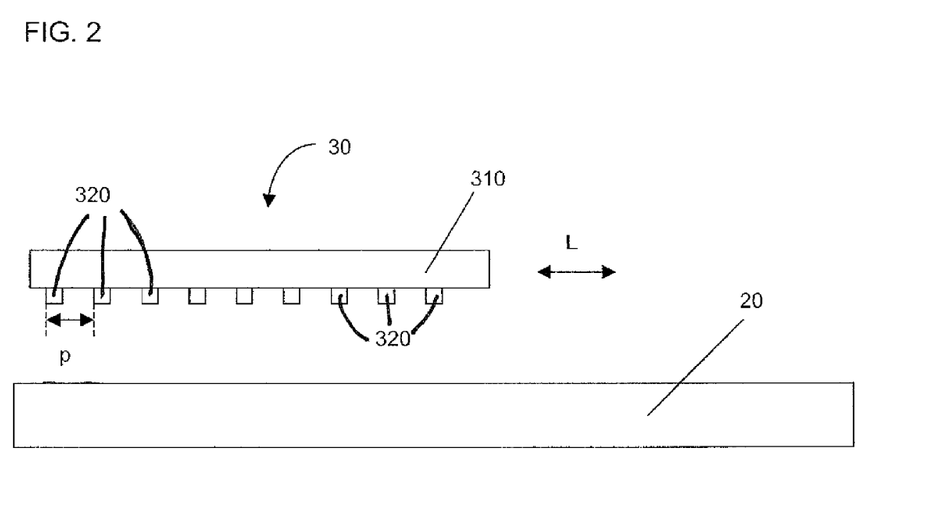
FIG. 2 includes an illustration of a cross-sectional view of the workpiece and a printer.

A second printer is illustrated in FIG. 2. Printer 30 has a printing head 310, with nozzles 320. This printer can be used for printing three colors, R, G, and B. In this system:

$c=3$ $z=n_1(c)=n_1(3)=9$, where $n_1=3$ $p=(c-1)=2s$

It is to be noted that since c is odd, $n_1$ is also odd, so that the total number of nozzles is odd. The liquid compositions can be supplied so that the first nozzle has R, the second nozzle has G, the third nozzle has B, the fourth nozzle has R, the fifth nozzle has G, the sixth nozzle has B, and so forth. The actual order of the colors is not important. As in FIG. 1, the printing head moves in and out of the plane of the paper to print, and can shift laterally in the direction shown by L.

In the embodiment shown in FIG. 1, the printer has four nozzles. In the embodiment shown in FIG. 2, the printer has nine nozzles. The actual number of nozzles can be greater than this and is limited only by practical manufacturing considerations. In some embodiments, the number of nozzles ranges from 6 to 24.

The printing delivery can be by any known system for depositing liquid materials. Some examples of printing techniques include, but are not limited to ink jet and continuous nozzle spray.

3. Method of Printing

Figure 3:
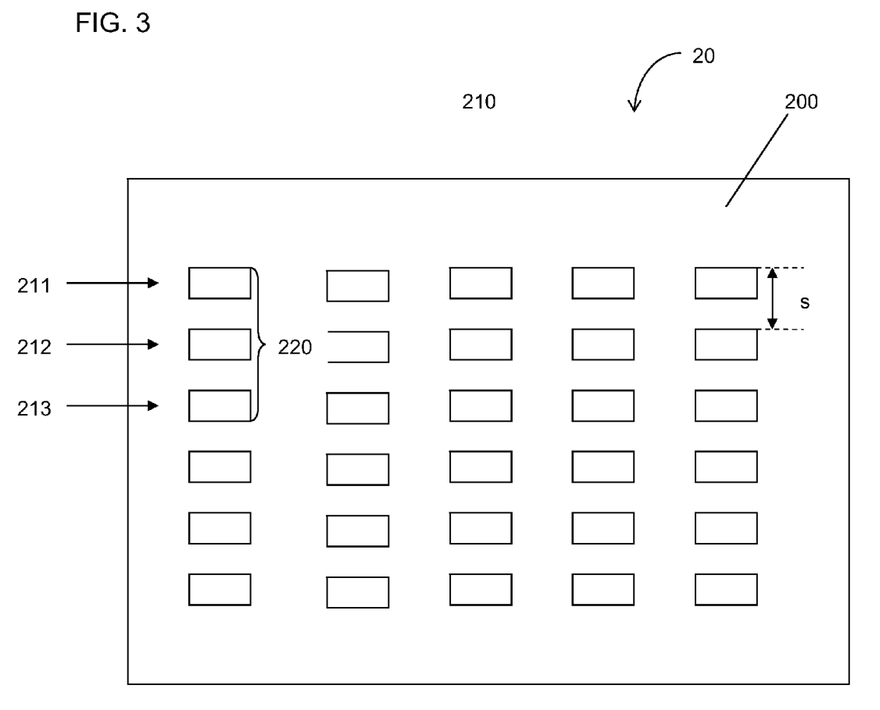
FIG. 3 includes another illustration of a cross-sectional view of the workpiece and a different printer.

FIG. 3 includes a plan view of workpiece 20 for making an electronic device. The workpiece includes a substrate 200 having a regular array of subpixel openings 210. The workpiece has a first edge 201 and an opposite edge 202. Only a few subpixels are illustrated in the figure. In practice, devices may have hundreds of subpixels or more. In some embodiments, the subpixel openings are defined by a containment structure (not shown) which can be a physical containment structure, a chemical containment structure, or both. The subpixel openings 210 are in a regular array of rows, shown as 211, 212, and 213. The subpixel pitch is shown as s. In this illustration, three subpixels together form pixel 220. In the illustrated embodiment, the subpixels 210 have a rectangular shape. Other subpixel shapes can be used, such as circular, oval, square, or polygonal. The printing direction is shown as x in the figure. Lateral movement is defined as movement in the y direction, perpendicular to the printing direction.

In the method described herein, a regular array of rows of subpixels in printed onto a workpiece. The number of colors printed is c, where c is at least 2, and the subpixels have a subpixel pitch s. The method comprises:

(a) providing a printing head having z nozzles arranged in a row with a spacing between the nozzles of p, where $z=n_1(c)$ and $p=(c-1)(s)$, the printhead being at a first position relative to the workpiece;

(b) providing c different printing inks, one for each of the c colors;

(c) supplying each of the printing inks to the nozzles in a regular alternating pattern;

(d) printing a first set of z rows of subpixels with the printing head;

(e) moving the workpiece laterally relative to the printing head by a distance $d_1$, where $d_1=z(s)$;

(f) printing a second set of z rows of subpixels with the printing head;

(g) repeating steps (e) and (f) $n_2$ times for a total of $(n_2+2)$ sets of z rows of subpixels;

where:

c is an integer greater than 1;

$n_1$ is an integer greater than 0, with the proviso that when c is an odd number, then $n_1$ is an odd number;

$n_2$, is an integer greater than 0.

The printing head has z nozzles, where z is a multiple of the number of colors, c. Thus, $z=n_1(c)$, where $n_1$ is an integer greater than 0, with the proviso that when c is an odd number, $n_1$ is also an odd number. In some embodiments, c is 2, 3, or 4. In some embodiments, when c=3, the colors are red, blue and green ("R, B, G"). In some embodiments, when c=4, the colors are red, blue, green and white. In some embodiments, $n_1$ is 2 or greater. In some embodiments, c=2 and $n_1$=4–8. In some embodiments, c=3 and $n_1$=3 or 5. In some embodiments, c=4 and $n_1$=2–4.

The printing head starts at a first printing position over the workpiece. This first position is referred to as A1, which will be discussed in a later section. In some embodiments, the printer is positioned at one edge of the workpiece, shown as 201 in FIG. 3, and aligned to be over the first row of subpixels. The nozzles are spaced apart by a distance p, which is in increments of subpixel pitch, so that they are all aligned to print in the subpixel rows. Thus, they are spaced apart by multiples of the subpixel pitch, s, and p=(c−1)(s). The term "multiple of a number" means a value which is the number times an integer greater than 0.

The printer prints across the workpiece in the x-direction, as shown in FIG. 3, to print a first set of rows of subpixels. The number of rows printed is equal to the number of nozzles on the printing head.

After completion of the printing of the first set of rows, the printing head moves laterally across the workpiece to an adjacent printing position. This position is referred to as A2, which will be discussed in a later section. This movement is parallel to the plane of the workpiece and in the y-direction, which is perpendicular to the row direction. The distance moved, $d_1$, is also a multiple of the subpixel pitch, s, and is equal to z(s). A second set of z rows is then printed. The printing can be in the opposite direction from the first printing or the printing head can return to the same side as for the first printing and print in the same direction. This is determined by the equipment and the software.

The above steps are repeated $n_2$ times until a first group totaling $n_2$+2 sets of subpixel rows have been printed.

In practice, the subpixel rows can be printed in any order. The movements of the printing head relative to the workpiece will be as discussed above, and the $n_2$+2 sets of subpixel rows will be printed starting from position A1, A2, A3, etc., but not necessarily in order. The exact order of printing will be determined by the most efficient way to utilize the printer.

Figure 4:
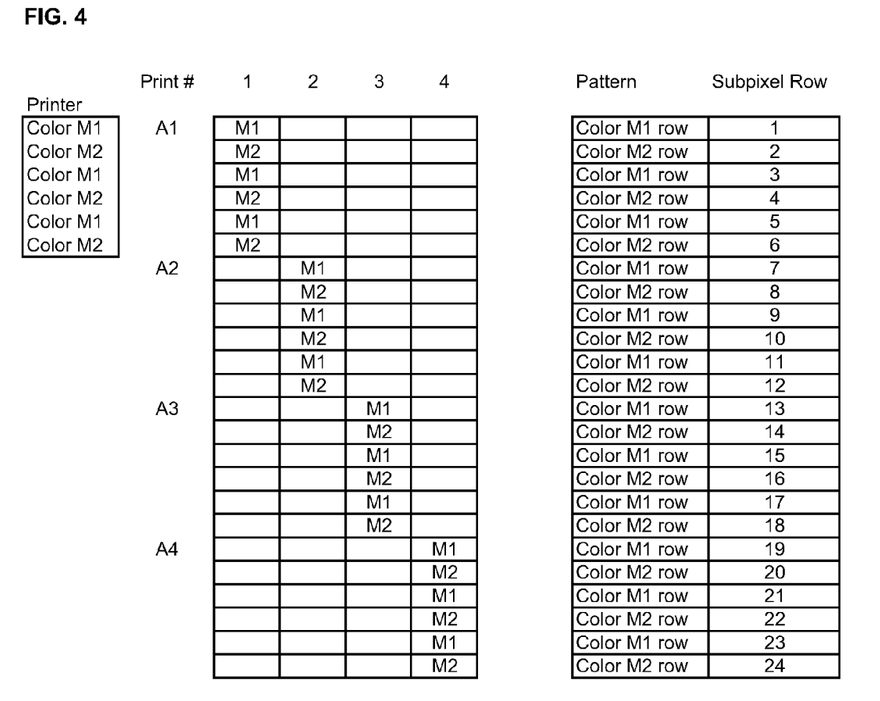
FIG. 4 includes a diagram illustrating a printing method with two colors.

The method described herein is illustrated further in FIGS. 4 through 7. In FIG. 4, there are 2 colors, M1 and M2. There are 6 nozzles on the printing head, and the spacing between nozzles is 1 unit of subpixel pitch. Thus, in this illustration:

$c=2$, $z=6$, $p=1(s)$, and $n_1=3$.

The colors are arranged as shown under the column labeled "Printer." The printing head is positioned at the first edge with the first nozzle, having color M1, over subpixel row 1. This is the first printing position shown as A1. The position A1 is defined as the subpixel row over which the first nozzle is placed. The printer prints across the workpiece in the row direction to form a row of color M1 in subpixel row 1, a row of color M2 in subpixel row 2, a row of color M1 in subpixel row 3, a row of color M2 in subpixel row 4, a row of color M1 in subpixel row 5, and a row of color M2 in subpixel row 6. This is shown in the column labeled Print #1. Only one subpixel is shown for each color for purposes of clarity, but each represents an entire row of subpixels. The printer then shifts laterally by a distance $d_1$ which is z subpixel units. In this case z=6. This is position A2 for the printer. The printer then prints a second set of rows: a row of color M1 in subpixel row 7, a row of color M2 in subpixel row 8, a row of color M1 in subpixel row 9, a row of color M2 in subpixel row 10, a row of color M1 in subpixel row 11, and a row of color M2 in subpixel row 12, as shown in the column labeled Print #2. Print #2 is shown shifted to the right of Print #1 for purposes of clarity. Both Print #1 and Print #2, as well as all the other Print numbers, represent full rows of printed subpixels across the workpiece. The printer then again shifts laterally by 6 subpixel units. This is position A3 for the printer. The printer then prints a third set of rows: a row of color M1 in subpixel row 13, a row of color M2 in subpixel row 14, a row of color M1 in subpixel row 15, a row of color M2 in subpixel row 16, a row of color M1 in subpixel row 17, and a row of color M2 in subpixel row 18, as shown in the column labeled Print #3. The printer then again shifts laterally by 6 subpixel units. This is position A4 for the printer. The printer then prints a fourth set of rows: a row of color M1 in subpixel row 19, a row of color M2 in subpixel row 20, a row of color M1 in subpixel row 21, a row of color M2 in subpixel row 22, a row of color M1 in subpixel row 23, and a row of color M2 in subpixel row 24, as shown in the column labeled Print #4.

At this point, the printer has printed four sets of six rows of subpixels, which is 24 subpixel rows. At this time the printing has reached the opposite edge of the workpiece. In practice, most devices will require many more rows, up to hundreds of subpixel rows and more, and these rows will be printed in an analogous manner. The 24 subpixel rows in the figure are shown only as an illustration.

The printed outcome is shown in the column labeled "Pattern". It can be seen that the pattern is complete with no subpixel rows missing. Thus the usable device area is from subpixel row 1 to subpixel row 24.

Figure 5:
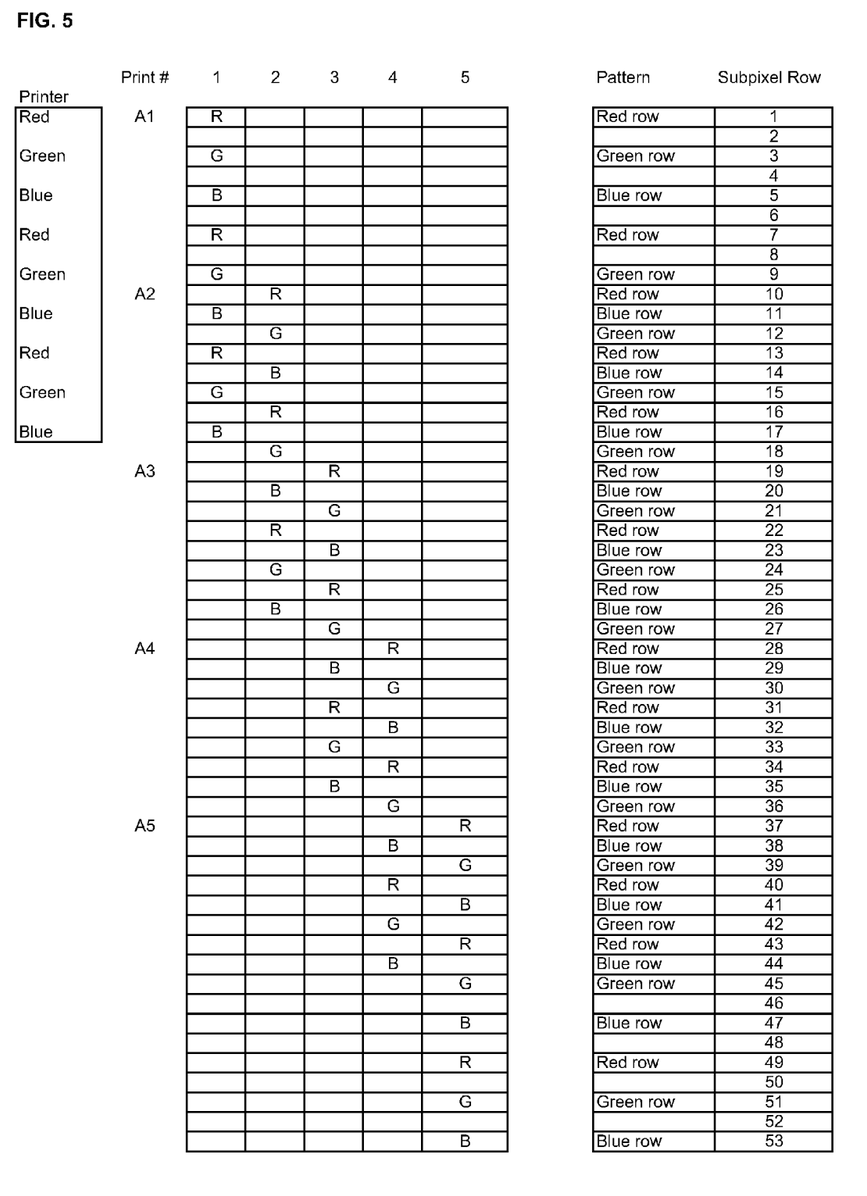
FIG. 5 includes a diagram illustrating a printing method with three colors.

In FIG. 5 there are 3 colors, red, blue, and green. There are 9 nozzles on the printing head, and the spacing between nozzles is 2 units of subpixel pitch. Thus, in this illustration:

$c=3$, $z=9$, $p=2(s)$, and $n_1=3$.

The colors are arranged as shown in the "Printer" column. The printing head is positioned at A1 over subpixel row 1, at the first edge of the workpiece. The printer prints across the workpiece in the row direction to form a row of red in subpixel row 1, a row of green in subpixel row 3, a row of blue in subpixel row 5, a row of red in subpixel row 7, a row of green in subpixel row 9, a row of blue in subpixel row 11, a row of red in subpixel row 13, a row of green in subpixel row 15, and a row of blue in subpixel row 17. This is shown in the column labeled Print #1. As in FIG. 3, only one subpixel is shown for each color for purposed of clarity, but each represents an entire row of subpixels. The printer then shifts laterally by a distance $d_1$ which is z subpixel units. In this case z=9. This is position A2 for the printer. The printer then prints a second set of rows: red in subpixel rows 10, 16, and 22; green in subpixel rows 12, 18, and 24; and blue in subpixel rows 14, 20, and 26. This is shown in the Print #2 column. Print #2 is shown shifted to the right of Print #1 for purposes of clarity. Both Print #1 and Print #2, as well as all the other Print numbers, represent full rows of printed subpixels across the workpiece. The printer is then shifted 9 subpixel units for Print #3, shifted again 9 subpixel units for Print #4, and shifted again 9 subpixel units for Print #5.

At this point, the printer has printed five sets of nine rows of subpixels, which is 45 subpixel rows. The printed outcome is shown in the column labeled "Pattern". It can be seen that subpixels are missing for subpixel rows 2, 4, 6, and 8 at the first edge and subpixel rows 46, 48, 50, and 52 at the opposite edge. Complete sets of the three colors, and thus the usable device area, can be found from subpixel row 9 to subpixel row 44. Although red, blue, and green are exemplified in this figure, other colors could be used.

Figure 6:
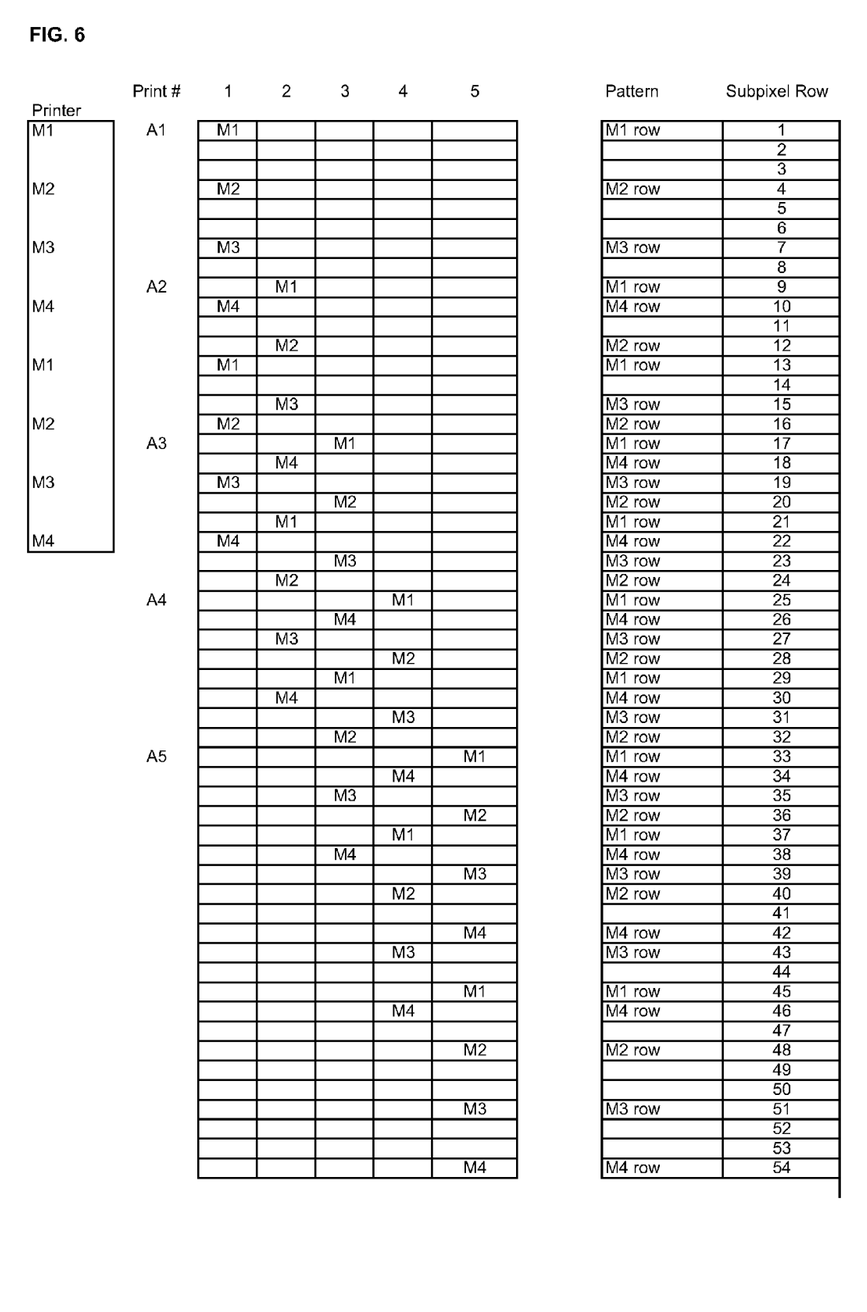
FIG. 6 includes another diagram illustrating a printing method with four colors.

In FIG. 6 there are 4 colors, M1, M2, M3 and M4. There are 8 nozzles on the printing head, and the spacing between nozzles is 3 units of subpixel pitch. Thus, in this illustration:

$c=4$, $z=8$, $p=3(s)$, and $n_1=2$.

The colors are arranged as shown in the "Printer" column. The printing head is positioned at A1 over subpixel row 1, at the first edge of the workpiece. The printer prints across the workpiece in the row direction to form a row of M1 in subpixel row 1, a row of M2 in subpixel row 4, a row of M3 in subpixel row 7, a row of M4 in subpixel row 10, a row of M1 in subpixel row 13, a row of M2 in subpixel row 16, a row of M3 in subpixel row 19, and a row of M4 in subpixel row 22. This is shown in the column labeled Print #1. As in FIG. 3, only one subpixel is shown for each color for purposed of clarity, but each represents an entire row of subpixels. The printer then shifts laterally by a distance $d_1$ which is z subpixel units. In this case z=8. This is position A2 for the printer. The printer then prints a second set of rows: M1 in subpixel rows 9 and 21; M2 in subpixel rows 12 and 24; M3 in subpixel rows 15 and 27; and M4 in subpixel rows 18 and 30. This is shown in the Print #2 column. Print #2 is shown shifted to the right of Print #1 for purposes of clarity. Both Print #1 and Print #2, as well as all the other Print numbers, represent full rows of printed subpixels across the workpiece. The printer is then shifted 8 subpixel units for Print #3, shifted again 8 subpixel units for Print #4, and shifted again 8 subpixel units for Print #5.

At this point, the printer has printed five sets of eight rows of subpixels, which is 40 subpixel rows.

The printed outcome is shown in the column labeled "Pattern". It can be seen that subpixels are missing for subpixel rows 2, 3, 5, 6, 8, 11 and 14 at the first edge and subpixel rows 41, 44, 47, 49, 50, 52, and 53 at the opposite edge. Complete sets of the four colors, and thus the usable device area, can be found from subpixel row 15 to subpixel row 38. An exemplary four-color system uses the colors red, green, blue, and white. Other color sets can be used, as desired.

In some cases, not all the colors of a device are printed. One or more colors may be deposited using other deposition methods. Such methods include, but are not limited to, vapor deposition, thermal transfer, and continuous liquid deposition techniques such as spin coating, gravure coating, curtain coating, dip coating, slot-die coating, and spray coating. In these cases, the printing must leave open spaces for the non-printed colors, which can be applied before or after the printing step. For the purposes of the printing pattern, an open space is counted as a color.

Figure 7:
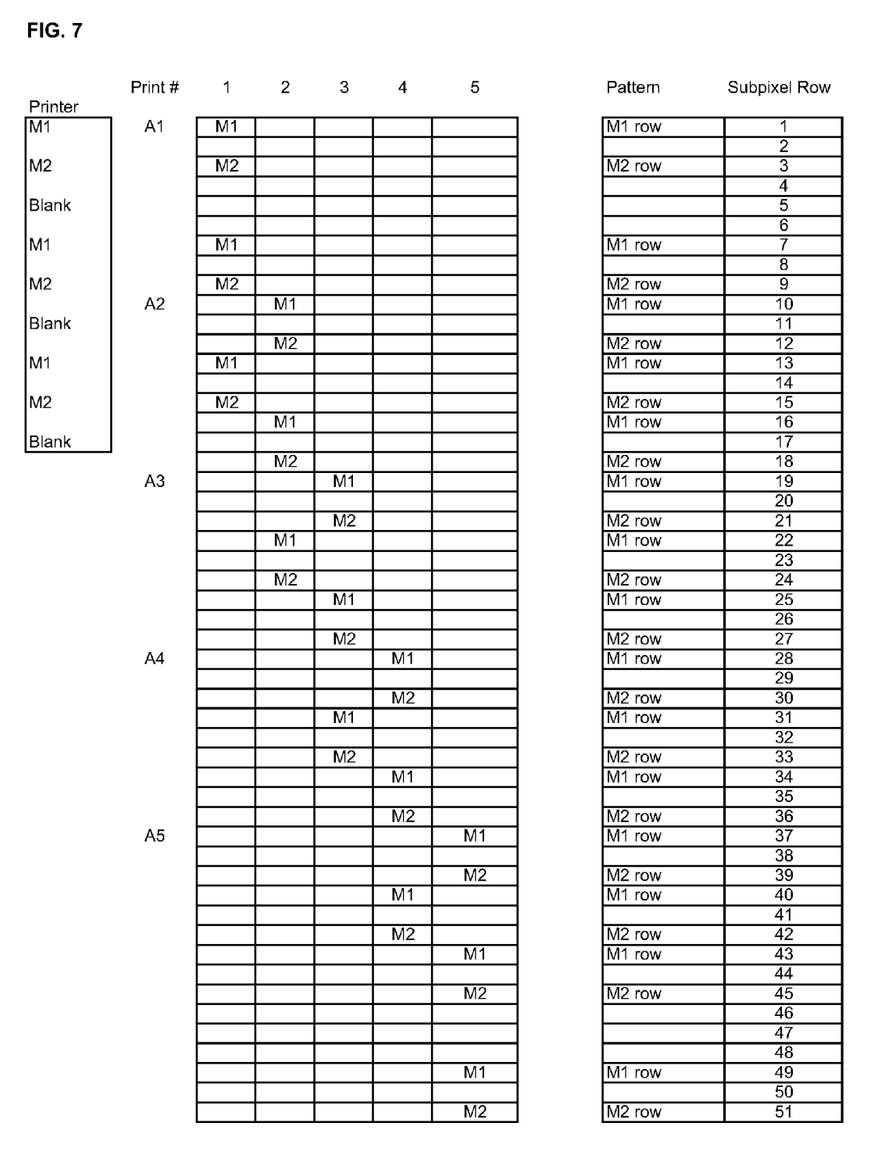
FIG. 7 includes another diagram illustrating a printing method for two colors.

An example of this is illustrated in FIG. 7. There are 2 colors, M1 and M2, and an open space for a third color to be deposited at a different time, shown as "blank" in the figure. This is counted as 3 colors. There to are three nozzles printing M1, three nozzles printing M2, and three nozzles that are not printing. The non-printing nozzles may or may not be physically present on the printing head. If the non-printing nozzles are not present, there is a space for them and the space is counted as a nozzle for the purposed of the printing pattern. Thus, this is counted as a total of nine nozzles. The different liquid compositions, one for each color and the lack of one for the open space, are supplied in a regular alternating pattern. The spacing between nozzles (printing nozzles and non-printing nozzles) is two units of subpixel pitch. Thus, in this illustration:

$c=3$, $z=9$, $p=(c-1)s=2s$, and $n_1=3$.

The colors are arranged as shown in the "Printer" column, where "blank" indicates a non-printing nozzle. The printing head is positioned at A1 over subpixel row 1, at the first edge of the workpiece. The printer prints across the workpiece in the row direction to form rows of M1 color in subpixel rows 1, 7, and 13, and rows of M2 color in subpixel rows 3, 9, and 15. This is shown in the column labeled Print #1. As in FIG. 3, only one subpixel is shown for each color for purposed of clarity, but each represents an entire row of subpixels. The printer then shifts laterally by a distance $d_1=z$, which is 9 subpixel units. This is position A2 for the printer. The printer then prints a second set of rows: M1 color in subpixel rows 10, 16, and 22, and rows of M2 color in subpixel rows 12, 18, and 24. This is shown in the Print #2 column. Print #2 is shown shifted to the right of Print #1 for purposes of clarity. Both Print #1 and Print #2, as well as all the other Print numbers, represent full rows of printed subpixels across the workpiece. The printer is then shifted 9 subpixel units for Print #3, shifted again 9 subpixel units for Print #4, and shifted again 9 subpixel units for Print #5.

At this point, the printer has printed five sets of nine rows of subpixels, including the rows from non-printing nozzles, which is 45 rows.

The printed outcome is shown in the column labeled "Pattern". It can be seen that there are open subpixels that are available for a third color in the non-printing rows: subpixel rows 5, 8, 11, etc. Complete sets of two colors plus blank space for the third color, and thus the usable device area, can be found from subpixel row 7 to subpixel row 45. In some embodiments, the printed colors will be red and green, with blue added separately. Other combinations of colors can be used.

4. Electronic Device

Devices for which the printing method described herein can be used include organic electronic devices. The term "organic electronic device" or sometimes just "electronic device" is intended to mean a device including one or more organic semiconductor layers or materials. An organic electronic device includes, but is not limited to: (1) a device that converts electrical energy into radiation (e.g., a light-emitting diode, light emitting diode display, diode laser, or lighting panel), (2) a device that detects a signal using an electronic process (e.g., a photodetector, a photoconductive cell, a photoresistor, a photoswitch, a phototransistor, a phototube, an infrared ("IR") detector, or a biosensors), (3) a device that converts radiation into electrical energy (e.g., a photovoltaic device or solar cell), (4) a device that includes one or more electronic components that include one or more organic semiconductor layers (e.g., a transistor or diode), or any combination of devices in items (1) through (4).

In such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers. Additional electroactive layers may be present between the light-emitting layer and the electrical contact layer(s).

It is well known to use organic electroluminescent compounds as the active component in such devices to provide the necessary colors. The printing method described herein is suitable for the printing of liquid compositions containing electroluminescent materials having different colors. Such materials include, but are not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

To form the printing inks, the above materials are dissolved or dispersed in a suitable liquid composition. A suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methylpyrrolidone) esters (such as ethylacetate) alcohols (isopropanol), keytones (cyclopentatone) and mixtures thereof. Suitable solvents for photoactive materials have been described in, for example, published PCT application WO 2007/145979.

One example of an organic electronic device structure is an OLED. The device has a first electrical contact layer, which is an anode layer, and a second electrical contact layer, which is a cathode layer 160. A photoactive layer is between them. Additional layers may optionally be present. Adjacent to the anode may be a buffer layer. Adjacent to the buffer layer may be a hole transport layer, comprising hole transport material. Adjacent to the cathode may be an electron transport layer, comprising an electron transport material. As an option, devices may use one or more additional hole injection or hole transport layers next to the anode and/or one or more additional electron injection or electron transport layers next to the cathode.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A method of printing a regular array of rows of subpixels on a workpiece, the subpixels having c different colors and having a subpixel pitch s, said method comprising:
    (a) providing a printing head having z nozzles arranged in a row with a spacing between the nozzles of p, where $z=n_1(c)$ and $p=(c-1)(s)$, the printhead being at a first position relative to the workpiece;
    (b) providing c different printing inks, one for each of the c colors;
    (c) supplying each of the printing inks to the nozzles in a regular alternating pattern;
    (d) printing a first set of z rows of subpixels with the printing head;
    (e) moving the workpiece laterally relative to the printing head by a distance $d_1$, where $d_1=z(s)$;
    (f) printing a second set of z rows of subpixels with the printing head;

(g) repeating steps (e) and (f) $n_2$ times for a total of $(n_2+2)$ sets of z rows of subpixels;

where:

$c$ is an integer greater than 1;

$n_1$ is an integer greater than 0, with the proviso that when $c$ is an odd number, then $n_1$ is an odd number;

$n_2$, is an integer greater than 0.

2. The method of claim 1, wherein $c=2$, 3, or 4.

3. The method of claim 1, wherein $n_1$ is at least 2.

4. The method of claim 1, wherein $c=2$ and $n_1=4-8$, $n_2=3$.

5. The method of claim 1, wherein $c=3$ and $n_1=3$ or 5.

6. The method of claim 1, wherein $c=4$, $n_1=2-4$.

7. The method of claim 1, wherein each printing ink comprises an electroluminescent material and a liquid medium.

* * * * *